(12) United States Patent
Freeke

(10) Patent No.: US 7,671,674 B2
(45) Date of Patent: Mar. 2, 2010

(54) AMPLIFIER CIRCUIT WITH AUTOMATIC GAIN CORRECTION

(75) Inventor: Arnold Jan Freeke, Nijmegen (NL)

(73) Assignee: NXP B.V., Eindhoven (NL)

( * ) Notice: Subject to any disclaimer, the term of this patent is extended or adjusted under 35 U.S.C. 154(b) by 334 days.

(21) Appl. No.: 11/596,829

(22) PCT Filed: May 10, 2005

(86) PCT No.: PCT/IB2005/051524

§ 371 (c)(1),
(2), (4) Date: Nov. 16, 2006

(87) PCT Pub. No.: WO2005/114834

PCT Pub. Date: Dec. 1, 2005

(65) Prior Publication Data

US 2007/0241813 A1      Oct. 18, 2007

(30) Foreign Application Priority Data

May 18, 2004 (EP) .................................. 04102180

(51) Int. Cl.
*H03F 3/45* (2006.01)
(52) U.S. Cl. ..................... 330/69; 330/124 R; 330/258; 330/260

(58) Field of Classification Search .................... 330/69, 330/124 R, 252, 258, 254, 260
See application file for complete search history.

(56) References Cited

U.S. PATENT DOCUMENTS

| 3,992,584 | A | 11/1976 | Dugan et al. | |
| 6,507,223 | B2 * | 1/2003 | Felder | 327/77 |
| 6,924,696 | B2 * | 8/2005 | Wentink | 330/69 |
| 2004/0080365 | A1 * | 4/2004 | Wentink | 330/69 |

* cited by examiner

Primary Examiner—Michael B Shingleton

(57) ABSTRACT

The present invention relates to an amplifier circuit and system, and to a method of compensating a gain imbalance generated in a complementary amplifier stage with first and second amplifier means (22, 24) in a bridge configuration. A compensation offset current is generated in response to the values of input signals supplied to respective inputs of said first and second amplifier means, and the compensation offset current is injected to a junction node between the inputs of the first and second amplifier means (22, 24). Thereby, it can be ensured that the gain of the first and second amplifier means does not depend on the kind of input signals, i.e. balanced or unbalanced input signals. An automatic gain correction can thus be achieved and the requirement of additional control signals or control terminals for selection of gain control circuits depending on the kind of input source or input configuration of the amplifier circuit can be dropped.

10 Claims, 5 Drawing Sheets

AMPLIFIER CIRCUIT WITH AUTOMATIC GAIN CORRECTION

The present invention relates to a method of compensating a gain imbalance generated in a complementary amplifier stage with first and second amplifier means in a bridge configuration. Furthermore, the present invention relates to an amplifier circuit and system in which the compensation method is applied.

Amplifier circuits, such as audio amplifiers, are often arranged to produce balanced differential output signals from balanced or unbalanced differential input signals. Balanced line signals are pairs of analog signals of equal amplitude but of opposite polarity, which are transmitted through cables and received by a circuitry that amplifies the difference between the two signals. Any common mode components in the signal pair, which may be obtained both from radiated noise picked up by the cable and from hum due to ground loops between interconnected elements of the system, are cancelled out and rejected by the receiving differential amplifier circuitry, producing an amplified output lacking most of the common input noise. Thus, balanced line circuits are better able to discriminate signal from noise, resulting in improved transmission quality.

Amplifier circuits for use with balanced lines should thus be able to amplify two input signals of opposite polarity, i.e. balanced input signals, and produce balanced output signals. In addition, such amplifier circuits should be able to create balanced output signals from an unbalanced signal source, where needed, such as at the transmitting end of balanced lines in some systems. These amplifier circuits should not only reject as much of the common mode components in the input signals as possible, but should also contribute as little of their own distortion or noise as possible to the balanced output signals.

FIG. 8 shows a schematic circuit diagram of a complementary dual bridge tied load (BTL) audio power amplifier which may be made e.g. in BCDMOS (Bipolar CMOS DMOS) technology. This conventional audio power amplifier contains two independent amplifiers in BTL configuration which individually can be switched in line driver mode, with e.g. 16 dB gain, or in amplifier mode, with e.g. 26 dB gain. In general, a complementary amplifier stage is to be understood here as an amplifier stage with a high side P component and a low side N component, e.g. a PNP-NPN output stage or a PDMOST-NDMOST output stage. The specific circuit configuration of FIG. 8 shows an unbalanced input configuration, where an input signal $v_i$ is supplied to the upper amplifier which generates an output signal $v_{o1}$, while the input of the lower amplifier is fixed to a reference potential, such as ground potential, which is also the reference potential of the input signal $v_i$ of the upper amplifier. The lower amplifier generates an output signal $v_{o2}$.

The asymmetrical input configuration shown in FIG. 8 may alternatively be called "unbalanced input configuration" or "single ended input configuration". In this example, the upper and lower amplifiers are differential amplifiers having respective feedback resistors R and input resistors r.

The amplification $A_+$ between the output signal $v_{o1}$ of the upper amplifier and the input signal of $v_i$ of the upper amplifier can be expressed as follows:

$$A_+ = \frac{v_{o1}}{v_i} = 1 + \frac{R}{2r} \tag{1}$$

Additionally, the amplification A between the output signal $v_{o2}$ of the lower amplifier and the input signal $v_i$ of the upper amplifier can be expressed as follows:

$$A_- = \frac{v_{o2}}{v_i} = -\frac{R}{2r} \tag{2}$$

Comparing the equations (1) and (2) a gain imbalance can be observed, i.e. the output signal $v_{o1}$ of the upper amplifier is larger than the output signal $v_{o2}$ of the lower amplifier, which causes the output signal $v_{o1}$ of the upper amplifier to clip first, i.e., to reach the upper limit before the output voltage $v_{o2}$ of the lower amplifier. This leads to a reduction of the maximum available undistorted output power.

The total gain A of the amplifier circuit is obtained as follows:

$$A = \frac{v_{o1} - v_{o2}}{v_i} = 1 + \frac{R}{r} \tag{3}$$

FIG. 9 shows an amplifier circuit similar to the circuit of FIG. 8 but in a symmetrical input configuration, which may alternatively be called "differential input configuration" or "balanced input configuration". Here, a balanced pair of input signals $(\frac{1}{2})*v_i$ and $-(\frac{1}{2})*v_i$ is applied to the respective inputs of the upper and lower amplifiers, i.e. the input signal of the upper amplifier has the same amplitude but opposite polarity compared to the other input signal applied to the lower amplifier.

In the above symmetrical input configuration, the amplification $A_+$ between the input signal $v_i$ and the upper output signal $v_{o1}$ can be expressed as follows:

$$A_+ = \frac{v_{o1}}{v_i} = \frac{1}{2}\left(1 + \frac{R}{r}\right) \tag{4}$$

Additionally, the amplification between the lower output signal $v_{o2}$ and the input signal $v_i$ can be expressed as follows:

$$A_- = \frac{v_{o2}}{v_i} = -\frac{1}{2}\left(1 + \frac{R}{r}\right) \tag{5}$$

Based on the above equations (4) and (5), the gain A of the amplifier circuit can be obtained as follows:

$$A = \frac{v_{o1} - v_{o2}}{v_i} = 1 + \frac{R}{r} \tag{6}$$

However, although the same amplification A is obtained for both symmetrical and asymmetrical input configurations or sources, a problem arises from the fact that a reduced maximum rms (rated mean square) output power is obtained with unbalanced input signals, as explained in the following.

With an asymmetrical input signal, one bridge half will have a highest gain as defined in equation (1). Hence, the maximum rms input signal before the output starts clipping is obtained as follows:

$$V_{irms,max} = \frac{\frac{V_{orms,max}}{2}}{A_+} = \frac{V_{orms,max}}{2 \cdot A_+} \quad (7)$$

With this input signal, the maximum differential rms output signal can be obtained as follows based on equation (3):

$$v_{orms,max,unbal} = \left(1 + \frac{R}{r}\right) * V_{irms,max} = \frac{\left(1 + \frac{R}{r}\right)}{\left(2 + \frac{R}{r}\right)} * V_{orms,max} \quad (8)$$

Consequently, the maximum rms output power (THD (Total Harmonic Distortion)=0.5%) can be obtained can be follows:

$$P_{out,unbal} = \frac{\left(1 + \frac{R}{r}\right)^2}{\left(2 + \frac{R}{r}\right)^2} * P_{out} \quad (9)$$

In the amplifier mode of the above amplifier circuit, resistance values R=9656Ω and r=501Ω may be used, which leads to an amplification A=20.3 (26.1 dB) and thus to a ratio $P_{out,unbal}/P_{out}$=0.91. On the other hand, in the line driver mode, resistance values R=8.557Ω and r=1600Ω may be used, which leads to an amplification A=6.35 (16.1 dB) and thus to a ratio $P_{out,unbal}/P_{out}$=0.75. Hence, with an unbalanced input configuration, the gain setting influences the maximum rms output power. Moreover, at different load resistances, the maximum rms output power will vary in case of an unbalanced input source.

As a known solution to the above problem, a gain correction circuit has been proposed for asymmetrical configurations. FIG. 10 shows a complementary amplifier circuit similar to the configuration of FIGS. 8 and 9 with an additional gain correction circuit consisting of a buffer circuit B and a resistor $R_0$. The gain correction circuit is connected to the input of the upper amplifier to which the input signal $v_i$ is applied. With a superposition consideration, the transfer characteristic can be expressed as follows:

$$v_{01} = v_1\left(1 + \frac{R}{r}\left(\frac{R_0}{r + 2R_0}\right)\right) \quad (10)$$

$$v_{02} = -v_i\frac{R}{r}\left(\frac{r + R_0}{r + 2R_0}\right)$$

If the resistance value of the correction resistor $R_0$ is selected, a value $R_0=(R-r)/2$, the gain balance between the output signals $v_{o1}$ and $v_{o2}$ can be maintained even for asymmetrical input configurations where an input signal is applied only to the upper amplifier.

However, the circuit configuration of FIG. 10 only accepts asymmetrical input sources and cannot be used for symmetrical input signals. If both input configurations shall be used, it has been proposed to select the gain correction circuit with a control input, such as a specific pin of the amplifier device. However, this requires a housing with an additional lead or pin. Moreover, a specific control signal is required for switching between the asymmetrical and symmetrical input modes.

It is therefore an object of the present invention to provide an amplifier circuit or system and an improved compensation method, by means of which asymmetrical as well as symmetrical input signals can be accepted without requiring additional external control signals or terminals.

This object is achieved by an amplifier circuit as claimed in claim 1 and by a compensation method as claimed in claim 10.

Accordingly, the proposed injection of the compensation offset current provides the advantage that a gain imbalance correction is obtained without requiring any user setting via a control input, such as a bit or pin. Contrary to the circuitry of FIG. 10, the proposed gain imbalance correction scheme accepts unbalanced input signals at both input terminals of the amplifier circuit. Due to the fact that the compensation offset current is injected to the junction node, the gain imbalance correction does not contribute to noise or distortion performance of the amplifier circuit. The gain imbalance correction even improves the suppression or rejection of common mode signals.

The value of the compensation offset current is thus selected such that it is assured that the gain of the amplifier circuit does not depend on the kind of input signals provided, i.e. balanced or unbalanced signals. The same gain can thus be obtained for both balanced and unbalanced signals.

According to a first aspect, the value of the compensation offset current is set to correspond to the sum of the two input signals of the first and second amplifier means divided by the resistance value of a feedback resistor of the first and second amplifier means, such that the current flowing through the branch between the inputs of the first and second amplifier means balances the output signals and thus the gains of the first and second amplifier means.

The current generator means may comprise a first voltage-to-current converter to which an input voltage of the first amplifier means is applied together with an input bias voltage, and a second voltage-to-current converter to which an input voltage of the second amplifier means is applied together with the input bias voltage, wherein the output currents of the first and second voltage-to-current converters are summed to obtain the compensation offset current injected to the junction node. Thus, the sum of the two input voltages is obtained by summing corresponding current values obtained from the voltage-to-current converters.

According to a second aspect, the current generator means may comprise a buffer circuit which output is connected to the junction node via an injection resistor, wherein the value of an input voltage of the buffer circuit is selected to obtain the required compensation offset current at the junction node.

The input voltage of the buffer circuit can be obtained by connecting the input terminal of the buffer circuit to a connection point between two resistors connected in series, wherein the respective other connection ends of the two resistors are connected to respective input terminals of the first and second amplifier means. Thereby, the required voltage is directly obtained via a resistor network. Furthermore, a current generating means may be connected to the connection point, the current generating means being arranged to supply a predetermined current to the connection point, wherein the predetermined current is selected to obtain the required compensation offset current at the junction node.

In particular, the current generating means may comprise a voltage-to-current converter connected with one input terminal to a connection point of another series connection of two resistors which are also connected at their other ends to the respective input terminals of the first and second amplifier means, and wherein the other input terminal of the voltageto-current converter is connected to a common reference potential of the amplifier circuit. Thus, the current generating means directly derives its output current from the voltage at the connection point of the other series connection. Thereby, circuit complexity can be kept low.

The buffer circuit may have an amplification value of one. On the other hand, if the buffer circuit has an arbitrary amplification value of α, the resistance value of the injection resistor can be adapted correspondingly to achieve the required compensation offset current. Thereby, the amplification or gain of the buffer circuit can be adjusted based on other circuit criteria, so as to optimize the circuit behavior.

Further advantageous developments of the present invention are defined in the dependent claims.

The present invention will now be described based on preferred embodiments with reference to the accompanying drawings in which.

The preferred embodiments will now be described based on a complementary dual BTL amplifier circuit as initially described.

Figure 1:
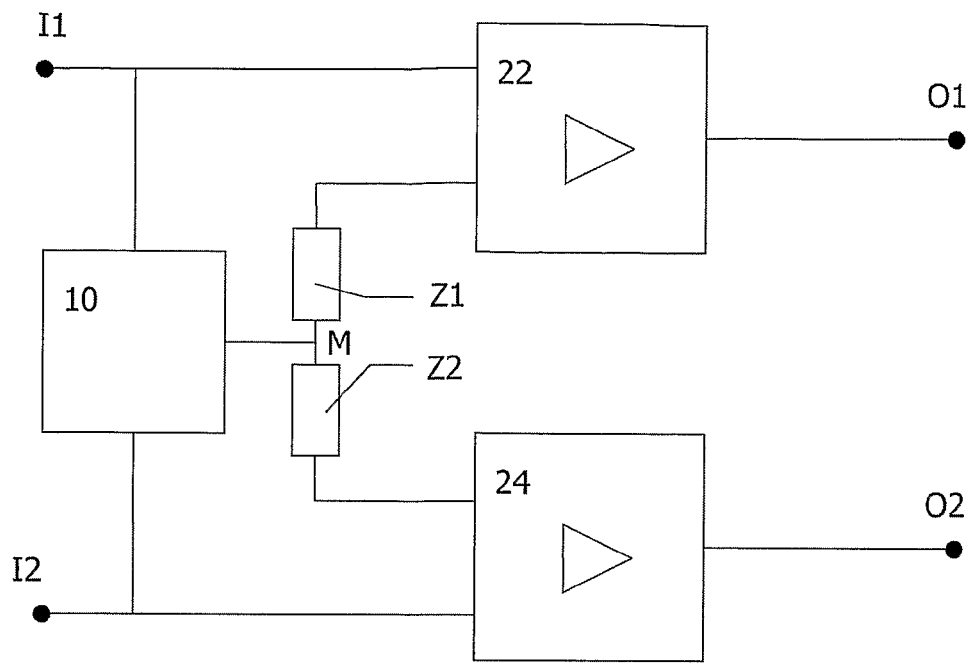
FIG. 1 shows a schematic block diagram of the general principle underlying the present invention.

FIG. 1 shows the general principle underlying the preferred embodiments of the present invention. According to FIG. 1, the amplifier circuit comprises two input terminals I1 and I2, to which balanced as well as unbalanced signals can be applied. Furthermore, the amplifier circuit comprises two output terminals O1 and O2 at which a balanced output signal is obtained. The amplification is achieved by two complementary amplifiers 22, 24 which are connected at their input side via a series connection of two impedances Z1 and Z2. At the junction node between the two impedances Z1 and Z2 a predetermined compensation offset current is injected, which is generated by a current generator circuit 10 connected to both input terminals 11 and 12 of the amplifier circuit.

According to the preferred embodiments, the current generating circuit 10 is adapted to determine the values of the input signals I1 and I2 and to derive or generate a compensation offset current to be supplied to the junction node. The value of this compensation offset current is selected to balance the gains and thus the output signals O1 and O2 of the two amplifiers 22 and 24. In particular, any imbalance in the currents flowing through the impedances Z1 and Z2 is compensated by the current generating means 10 so as to obtain the balanced output signals O1 and O2.

Figure 8:
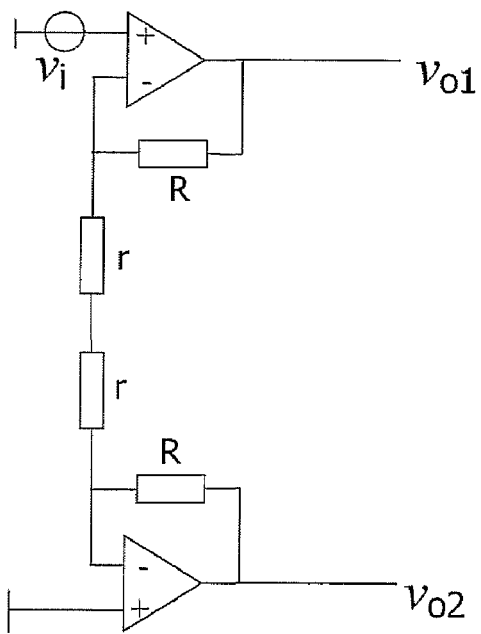
FIG. 8 shows a conventional amplifier circuit with an unbalanced input configuration.
Figure 9:
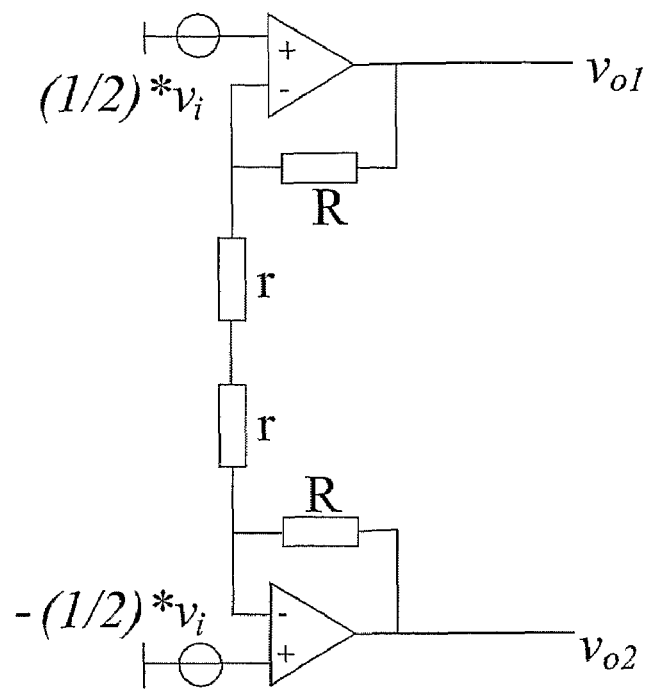
FIG. 9 shows a conventional amplifier circuit with a balanced input configuration.
Figure 10:
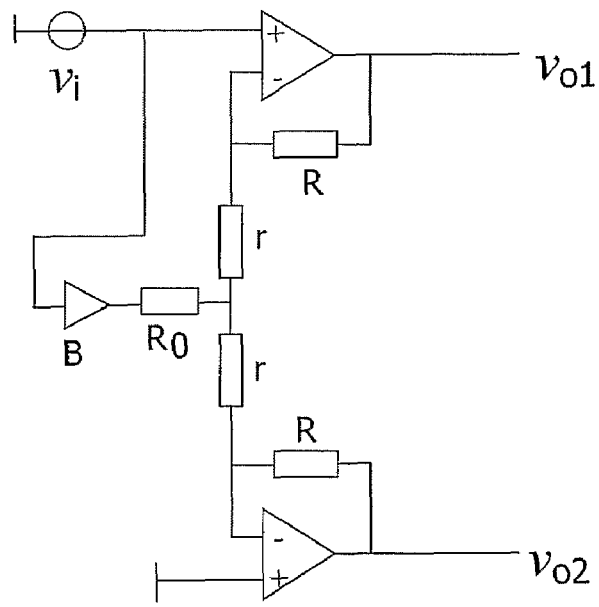
FIG. 10 shows a conventional amplifier circuit with a known gain correction circuit.

In the following, the above general principle is described in more detail based on the preferred embodiments which have been derived from the amplifier configuration as initially discussed with reference to FIGS. 8 to 10.

Figure 2:
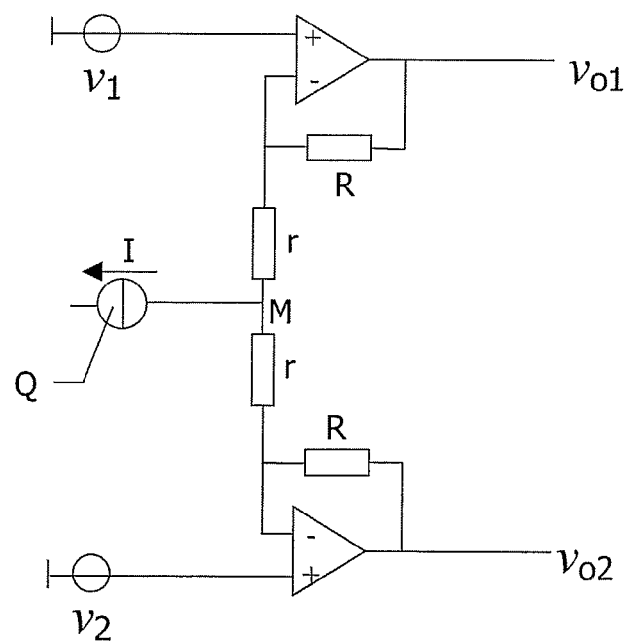
FIG. 2 shows a schematic circuit diagram of a balanced amplifier circuit according to a first preferred embodiment.

FIG. 2 shows a schematic circuit diagram of a complementary dual BTL amplifier circuit with a gain correction function for balancing the output signal $v_{o1}$ and $v_{o2}$, according to the first preferred embodiment. In the first preferred embodiment, a current source Q is connected to the junction node M between the two complementary amplifier circuits. The current source Q is arranged to generate a predetermined compensation offset current I supplied or injected to the junction node so as to balance the output signals $v_{o1}$ and $v_{o2}$.

Applying the superposition principle and correspondingly adding respective current flows at the junction node M, the transfer characteristic can be obtained as follows:

$$v_{01} = v_1 + \frac{R}{2r}(v_1 - v_2) + \frac{I}{2}R \qquad (11)$$

$$v_{02} = v_1 + \frac{R}{2r}(v_2 - v_1) + \frac{I}{2}R$$

Assuming symmetric inputs $v_1 = v_{cm} + v_d/2$ and $v_2 = v_{cm} - v_d/2$, and asymmetrical inputs $v_1 = v_{cm} + v_d$ and $v_2 = v_{cm}$, gain balance between the outputs $v_{o1}$ and $v_{o2}$ can be obtained by injecting a correction current or compensation offset current $I = -(v_1 + v_2)/R$. Thereby, gain balance between the output $v_{o1}$ and $v_{o2}$ can be maintained irrespective of symmetrical or asymmetrical input sources or configurations. Even the transfer of the common mode voltage $v_{cm}$ to the outputs $v_{o1}$ and $v_{o2}$ is suppressed. In particular, the injected compensation offset current I results in a common term or common signal portion in the output signals $v_{o1}$ and $v_{o2}$. Any distortion and/or noise contribution introduced by the compensation offset current I therefore does not influence the distortion and/or noise obtained in the differential output signal $v_{o1} - v_{o2}$.

Figure 3:
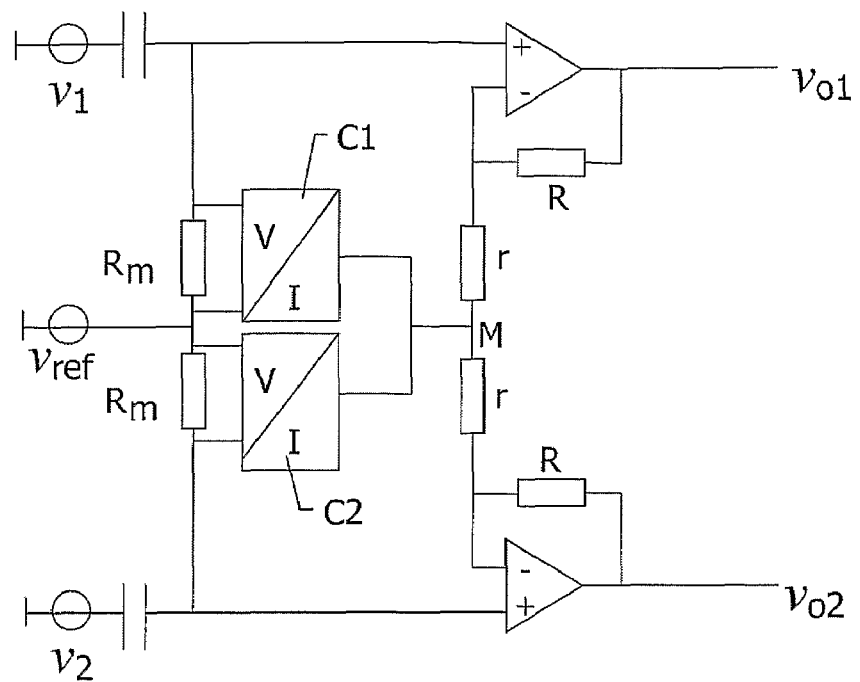
FIG. 3 shows a schematic circuit diagram of an implementation example of the balanced amplifier circuit according to the first preferred embodiment.

FIG. 3 shows a schematic circuit diagram of an implementation example of the above first preferred embodiment. As can be gathered from FIG. 3, the current source Q is implemented by adding two voltage-to-current converters (VI converters) C1 and C2, the input voltages of the VI converters C1 and C2 correspond to an output bias voltage $v_{ref}$ plus the amplifier input voltages $v_1$ and $v_2$, respectively. The output currents of the VI converters C1 and C2 are summed and injected to the junction node M. In particular, the input voltages of the VI converters C1 and C2 are generated by respective measuring resistors $R_m$ connected the inputs of the VI converters C1 and C2. As already mentioned, the injected compensation offset current I results in a common term or signal portion in the output signals $v_{o1}$ and $v_{o2}$. Thereby, any distortion and noise contribution of the VI converters C1 and C2 does not influence the distortion and/or noise of the differential output signal $v_{o1} - v_{o2}$. Thereby, design requirements for the VI converters C1 and C2 can be kept low at least with respect to distortions and noise contribution.

The VI converters may comprise any known converter circuits having differential amplifiers of transistor elements or any other conductor elements suitable to built up a VI converter circuit, i.e., a circuit with high input resistance or impedance and high output resistance or impedance.

Figure 4:
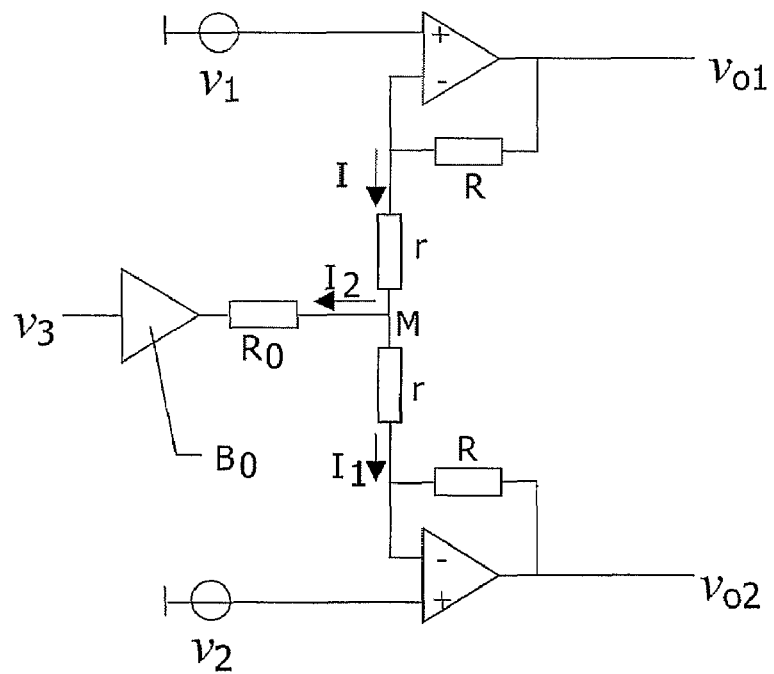
FIG. 4 shows a schematic circuit diagram of a balanced amplifier circuit according to a second preferred embodiment.

FIG. 4 shows a schematic circuit diagram of an amplifier circuit with a gain correction function according to the second preferred embodiment. In the second preferred embodiment, an injection offset current $I_2$ is injected via an injection resistor $R_0$ by using a voltage buffer circuit $B_0$ to which a compensation voltage $v_3$ is applied. Applying again the superposition principle, the relation between the output voltages $v_{o1}$ and $v_{o2}$ as a function of the input voltages $v_1$ and $v_2$ and the compensation voltage $v_3$ can be expressed as follows:

$$v_{01} = \qquad\qquad\qquad\qquad\qquad\qquad (12)$$
$$\frac{1}{r+r\,//\,R_0}\left((r+r\,//\,R_0+R)v_1 - R\cdot\frac{R_0}{R_0+r}v_2 - \frac{R(r+r\,//\,R_0)}{2R_0+r}v_3\right)$$
$$v_{02} = \frac{1}{r+r\,//\,R_0}\left((r+r\,//\,R_0=R)v_2 - R\cdot\frac{R_0}{R_0+r}v_1 - \frac{R(r+r\,//\,R_0)}{2R_0+r}v_3\right)$$

Assuming again symmetric input voltages $v_1 = v_{cm} + v_d/2$ and $v_2 = v_{cm} - v_d/2$, and asymmetrical input signals $v_1 = v_{cm} + v_d$ and $v_2 = v_{cm}$, where $v_{cm}$ designates the common mode voltage.

In the second preferred embodiment, gain balance between the output signals $v_{01}$ and $V_{02}$ can be achieved if the compensation voltage $v_3$ has the following value:

$$v_3 + \left(\frac{2R_0+r}{2R} + \frac{1}{2}\right)\cdot(v_1+v_2) \qquad\qquad (13)$$

Thereby, gain balance can be achieved for balanced and unbalanced input signals and, similar to the first preferred embodiment, the transfer of any common mode voltage $v_{cm}$ to the outputs of the amplifier circuit is suppressed.

Figure 5:
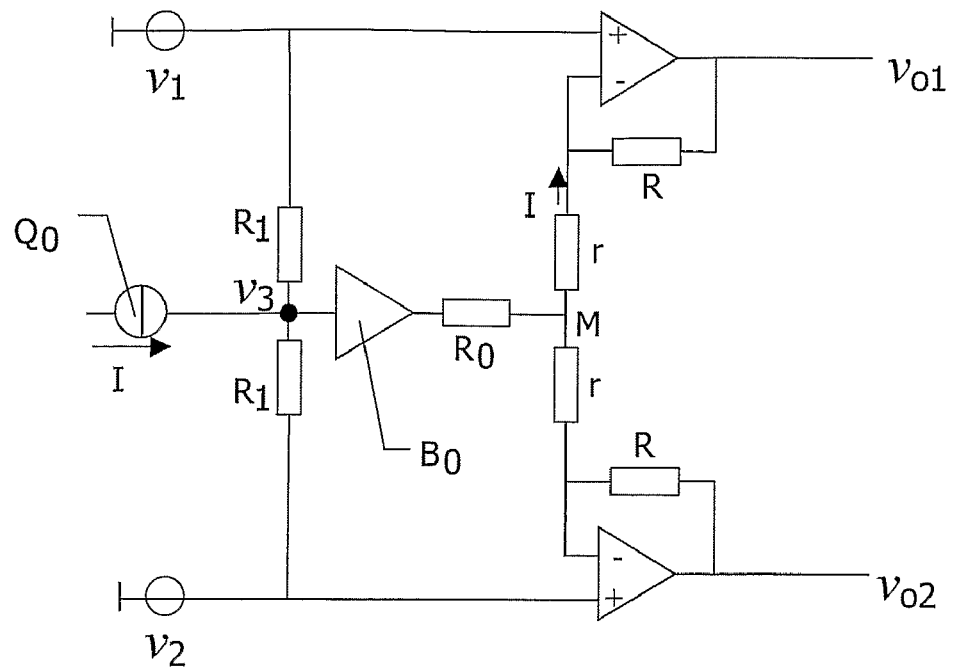
FIG. 5 shows a schematic circuit diagram of a first implementation example of the balanced amplifier circuit according to the second preferred embodiment.

FIG. 5 shows a first implementation example of the second preferred embodiment, wherein the compensation voltage $v_3$ is generated by adding a series connection of two resistors $R_1$ between the two input terminals of the differential amplifiers and connecting the input terminal of the buffer circuit $B_0$ to the connection point between the two resistors $R_1$ of the series connection. Furthermore, a current source $Q_0$ is connected to the connection point of the series connection.

Based on this schematic circuit configuration of FIG. 5, the relation between the compensation current generated by the current source $Q_0$ and the compensation voltage $v_3$ can be expressed as follows:

$$v_3 = \left(\frac{2R_0+r}{2R} + \frac{1}{2}\right)(v_1+v_2) = \frac{1}{2}(v_1+v_2) + I\frac{R_1}{2} \qquad (14)$$
$$I = 2\left(\frac{2R_0+r}{R\cdot R_1}\right)\left(\frac{v_1+v_2}{2}\right)$$

Thus, if a source $Q_0$ is arranged to generate the above current value, the correct or desired compensation offset current is injected to the junction node M. The current source $Q_0$ may be any suitable current generating circuit based on transistor means or other semiconductor elements.

Figure 6:
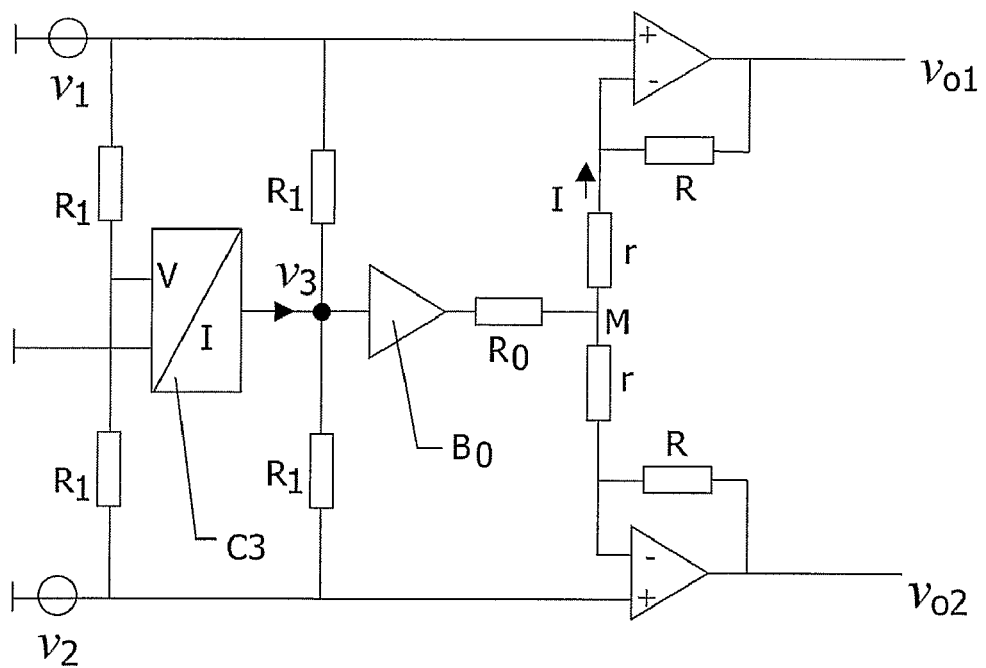
FIG. 6 shows a schematic circuit diagram of a second implementation example of the balanced amplifier circuit according to the second preferred embodiment.

FIG. 6 shows a second implementation example of the balanced amplifier circuit according to the second preferred embodiment, wherein the current source $Q_0$ of the first implementation example is replaced or realized by a VI converter B3 with suitable input circuitry. Here, the compensation voltage $v_3$ is obtained by generating the compensation current via the VI converter C3 to which a predetermined input voltage derived from the input voltages $v_1$ and $v_2$ of the amplifier circuit is applied. In particular, one input terminal of the VI converter C3 is connected to the reference potential of the amplifier circuit, e.g., ground potential. The other input terminal of the VI converter C3 is connected to a connection point of an additional series connection of two additional resistors $R_1$ which are connected to the respective input terminals of the differential amplifiers. Then, any suitable semiconductor circuitry with VI conversion characteristic can be used as the VI converter C3.

Figure 7:
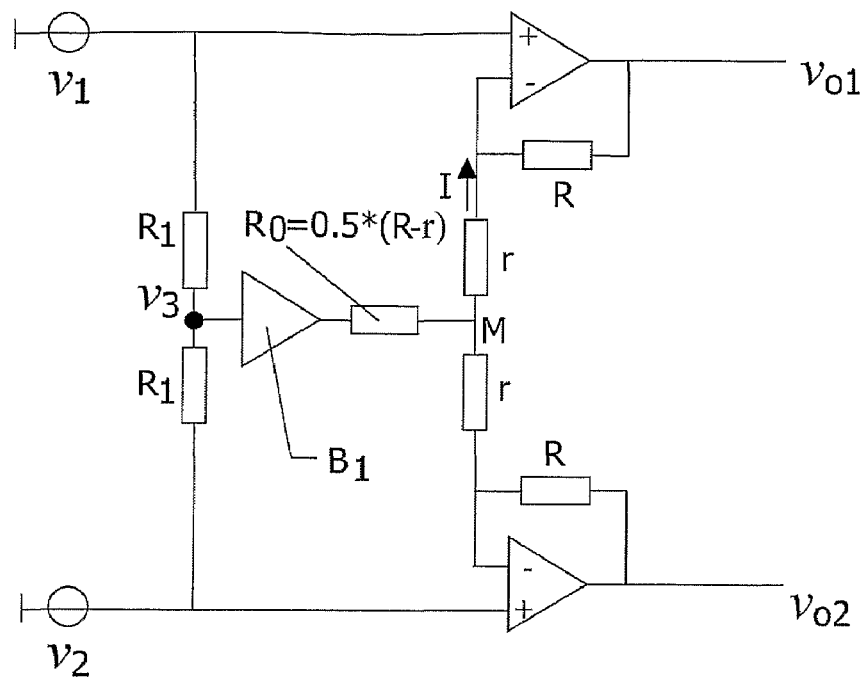
FIG. 7 shows a schematic circuit diagram of a third implementation example of the balanced amplifier circuit according to the second preferred embodiment.

FIG. 7 shows a third implementation example of the balanced amplifier circuit according to the second preferred embodiment, wherein the compensation voltage $v_3$ is supplied via a buffer amplifier $B_1$ with gain or amplification $\alpha$ and the injection resistor $R_0$. Due to the series connection of resistors $R_1$, the input voltage of the buffer amplifier $B_1$ corresponds to the value $(v_1+v_2)/2$. Hence, the resistance value of the injection resistor $R_0$ has to be selected as follows to obtain the required compensation of said current at the junction node M:

$$v_3 = \left(\frac{2R_0+r}{2R} + \frac{1}{2}\right)(v_1+v_2) \qquad\qquad (15)$$
$$= \frac{\alpha}{2}(v_1+v_2) \Rightarrow \left(\frac{2R_0+r}{2R}\right)(v_1+v_2)$$
$$= \frac{1}{2}(\alpha-1)\cdot(v_1+v_2) \Rightarrow R_0$$
$$= \frac{1}{2}(R(\alpha-1)-r)$$

Thereby, a buffer amplifier $B_1$ with any desired amplification can be used to optimize the characteristic of the amplifier circuit.

In summary, a general principle of using a current generator means at a junction point between the inputs of the power amplifiers is suggested to obtain an automatic gain correction, wherein the value of the current generated by the current generator means is selected so as to assure that the gain does not depend on the kind of input signals applied, i.e. balanced or unbalanced signals. The proposed implementations of this general concept are based on using a current source, which may be implemented by a pair of VI converters, or a voltage buffer compensation voltage, which may be generated by a compensation current supplied by a current source or a VI converter. Furthermore, gain correction can be applied if a buffer circuit with predetermined gain is used.

It is noted that the present invention can be applied to any kind of amplifier circuits, where balanced as well as unbalanced signals can be applied. The schematic circuit diagrams depicted in FIGS. 2 to 7 are only intended to show the circuit elements required for explaining the present invention. However, other circuit elements which (may) be required for specific functionalities of the amplifier circuits have been omitted for reasons of simplicity. Moreover, the depicted components may be replaced by other components of similar effect without departing from the scope of the present invention. In particular, the differential amplifiers or operational amplifiers can be replaced by any transistor-based or other amplification circuit. The preferred embodiments may thus vary within the scope of the attached claims.

The invention claimed is:

1. An amplifier circuit comprising:
   a complementary amplifier stage with first and second amplifier means in a bridge configuration, said first and second amplifier means comprising a first group of input terminals and a second group of input terminals; and
   current generator means for generating a compensation offset current and for injecting said compensation offset current to a junction node between said first group of input terminals of said first and second amplifier means, said current generator means being coupled to said second group of input terminals such that input signals that are supplied to said second group of input terminals of said first and second amplifier means are received by said current generator means;

wherein said current generator means is configured to generate said compensation offset current using the values of the input signals that are supplied to said second group of input terminals of said first and second amplifier means, to balance the outputs of said first and second amplifier means into equal amplitude but opposite polarity.

2. An amplifier circuit according to claim 1, wherein said current generator means comprising a current source, wherein the current source is configured to generate said compensation offset current based on the following equation:

$$I = -(v_1 + v_2)/R,$$

wherein I designates said compensation offset current, $v_1$ and $v_2$ designate respective voltage values of first and second input signals of said first and second amplifier means, and R designates the resistance value of a feedback resistor of said first and second amplifier means.

3. An amplifier circuit according to claim 1, wherein said current generator means comprises a first measuring resistor, a second measuring resistor, a first voltage-to-current converter and a second voltage-to-current converter, wherein a first input terminal of the first voltage-to-current converter is connected to a first end of the first measuring resistor and an input voltage of said first amplifier means is applied to the first input terminal of the first voltage-to-current converter and the first end of the first measuring resistor, wherein a second input terminal of the first voltage-to-current converter is connected to a second end of the first measuring resistor, wherein a first input terminal of the second voltage-to-current converter is connected to a first end of the second measuring resistor and an input voltage of said second amplifier means is applied to the first input terminal of the second voltage-to-current converter and the first end of the second measuring resistor, wherein a second input terminal of the second voltage-to-current converter is connected to a second end of the second measuring resistor, wherein the output currents of said first and second voltage-to-current converters are summed to obtain said compensation offset current injected to said junction node.

4. An amplifier circuit according to claim 1, wherein said current generator means comprises a buffer circuit whose output is connected to said junction node via an injection resistor, wherein said current generator means generates a compensation voltage and applies the compensation voltage to said buffer circuit, wherein the value of the compensation voltage that is applied to of said buffer circuit is obtained by the following equation:

$$v_3 = \left(\frac{2R_0 + r}{2R} + \frac{1}{2}\right) \cdot (v_1 + v_2),$$

wherein $v_3$ designates the value of the compensation voltage that is applied to said buffer circuit, $R_0$ designates the resistance value of said injection resistor, R designates the resistance value of a feedback resistor of said first and second amplifier means, r designates the resistance value of an input resistor connected between said first group of input terminals of said first and second amplifier means and said junction node, and $v_1$, $v_2$ designate voltage values of said input signals that are supplied to said first and second amplifier means.

5. An amplifier circuit according to claim 1, wherein said current generating means comprises a buffer circuit whose output is connected to said junction node via an injection resistor, two resistors that are connected in series and a current source, wherein an input terminal of said buffer circuit is connected to a connection point between said two resistors, wherein said current source is connected to said two resistors at the connection point between said two resistors, wherein said two resistors are connected to the input terminals of said first and second amplifier means such that input signals that are supplied to said first and second amplifier means are received by said two resistors, wherein said current source is configured to supply a current of a value:

$$I = 2\left(\frac{2R_0 + r}{R \cdot R_1}\right) \cdot \frac{v_1 + v_2}{2},$$

wherein I designates the value of said current, $R_0$ designates the resistance value of said injection resistor, $R_1$ designates respective resistance value of said two resistors that are connected in series, R designates the resistance value of a feedback resistor of said first and second amplifier means, r designates the resistance value of an input resistor connected between said first group of input terminals of said first and second amplifier means and said junction node, and $v_1$, $v_2$ designate respective voltage values of said input signals that are supplied to said first and second amplifier means.

6. An amplifier circuit according to claim 1, wherein said current generating means comprises a buffer circuit whose output is connected to said junction node via an injection resistor, two resistors that are connected in series, a voltage-to-current converter and another two resistors that are connected in series, wherein an input terminal of said buffer circuit is connected to a connection point between said two resistors, wherein an output terminal of said voltage-to-current converter is connected to said two resistors at the connection point between said two resistors, wherein said two resistors are connected to the input terminals of said first and second amplifier means such that input signals that are supplied to said first and second amplifier means are received by said two resistors, wherein a first input terminal of the voltage-to-current converter is connected to a connection point between said another two resistors, wherein said another two resistors are connected to the input terminals of said first and second amplifier means such that input signals that are supplied to said first and second amplifier means are received by said another two resistors, and wherein a second input terminal of said voltage-to-current converter is connected to a common reference potential of said amplifier circuit.

7. An amplifier circuit according to claim 4, wherein said buffer circuit has an amplification value of one.

8. An amplifier circuit according to claim 1, wherein said current generating means comprises a buffer circuit whose output is connected to said junction node via an injection resistor and two resistors that are connected in series, wherein an input terminal of said buffer circuit is connected to a connection point between said two resistors, wherein said two resistors are connected to the input terminals of said first and second amplifier means such that input signals that are supplied to said first and second amplifier means are received by said two resistors, wherein said buffer circuit has an amplification value of α, and said injection resistor has a resistance value of $R_0 = \frac{1}{2} \cdot (R \cdot (\alpha - 1) - r)$, wherein $R_0$ designates the resistance value of said injection resistor, R designates the resistance value of a feedback resistor of said first and second amplifier means, and r designates the resistance value of an input resistor connected between said first group of input terminals of said first and second amplifier means and said junction node.

9. A method of compensating a gain imbalance generated in a complementary amplifier stage with first and second amplifier means in a bridge configuration, said method comprising the steps of:

generating a compensation offset current by a current generator means using input signals that are supplied to a group of input terminals of said first and second amplifier means and the current generator means; and injecting said compensation offset current to a junction node between another group of input terminals of said first and second amplifier means to balance the outputs of said first and second amplifier means into equal amplitude but opposite polarity by the current generator means.

10. An amplifier system arranged to work with balanced and unbalanced input signals, said amplifier system comprising an amplifier circuit as claimed in claim 1.

* * * * *